(12) United States Patent  
Mashino

(10) Patent No.: US 7,936,568 B2
(45) Date of Patent: May 3, 2011

(54) CAPACITOR BUILT-IN SUBSTRATE AND METHOD OF MANUFACTURING THE SAME AND ELECTRONIC COMPONENT DEVICE

(75) Inventor: Naohiro Mashino, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 726 days.

(21) Appl. No.: 11/882,645

(22) Filed: Aug. 3, 2007

(65) Prior Publication Data
US 2008/0291649 A1 Nov. 27, 2008

(30) Foreign Application Priority Data

Aug. 10, 2006 (JP) .................................. 2006-217955

(51) Int. Cl.
*H05K 1/16* (2006.01)
(52) U.S. Cl. ........ 361/766; 361/763; 361/765; 361/738; 361/718; 174/253; 174/255; 257/300; 257/532; 257/700
(58) Field of Classification Search .................. 361/766, 361/763, 765, 738, 718; 174/253, 255, 700; 257/300, 532, 700
See application file for complete search history.

(56) References Cited

U.S. PATENT DOCUMENTS

| | | | | |
|---|---|---|---|---|
| 5,177,670 A * | 1/1993 | Shinohara et al. | ............ | 361/738 |
| 5,847,423 A | 12/1998 | Yamamichi | ............ | 257/296 |
| 6,274,224 B1 * | 8/2001 | O'Bryan et al. | ............ | 428/209 |
| 6,512,182 B2 * | 1/2003 | Takeuchi et al. | ............ | 174/256 |
| 6,573,584 B1 * | 6/2003 | Nagakari et al. | ............ | 257/528 |
| 6,577,490 B2 * | 6/2003 | Ogawa et al. | ............ | 361/306.1 |
| 6,740,411 B2 * | 5/2004 | Kojima et al. | ............ | 428/413 |
| 6,754,952 B2 * | 6/2004 | Takano et al. | ............ | 29/852 |
| 6,809,268 B2 * | 10/2004 | Hayashi et al. | ............ | 174/260 |
| 6,871,396 B2 * | 3/2005 | Sugaya et al. | ............ | 29/860 |
| 6,897,544 B2 * | 5/2005 | Ooi et al. | ............ | 257/532 |

(Continued)

FOREIGN PATENT DOCUMENTS

EP 0817259 A2 1/1998

(Continued)

OTHER PUBLICATIONS

European Search Report dated Mar. 28, 2008.

*Primary Examiner* — Xiaoliang Chen
(74) *Attorney, Agent, or Firm* — Kratz, Quintos & Hanson, LLP

(57) ABSTRACT

A capacitor built-in substrate of the present invention includes; a base resin layer; a plurality of capacitors arranged side by side in a lateral direction in a state that the capacitors are passed through the base resin layer, each of the capacitors constructed by a first electrode provided to pass through the base resin layer and having projection portions projected from both surface sides of the base resin layer respectively such that the projection portion on one surface side of the base resin layer serves as a connection portion, a dielectric layer for covering the projection portion of the first electrode on other surface side of the base resin layer, and a second electrode for covering the dielectric layer; a through electrode provided to pass through the base resin layer and having projection portions projected from both surface sides of the base resin layer respectively; and a built-up wiring formed on the other surface side of the base resin layer and connected to the second electrodes of the capacitors and one end side of the through electrode.

3 Claims, 13 Drawing Sheets

U.S. PATENT DOCUMENTS

| | | | |
|---|---|---|---|
| 6,909,592 B2* | 6/2005 | Seo | 361/306.3 |
| 6,917,514 B2* | 7/2005 | Mido et al. | 361/533 |
| 6,921,977 B2* | 7/2005 | Shimizu et al. | 257/758 |
| 6,931,724 B2* | 8/2005 | Rokugawa et al. | 29/852 |
| 6,936,774 B2 | 8/2005 | Sugaya et al. | |
| 6,952,049 B1* | 10/2005 | Ogawa et al. | 257/700 |
| 6,961,230 B2* | 11/2005 | Otsuka et al. | 361/306.2 |
| 6,995,322 B2* | 2/2006 | Chan et al. | 174/262 |
| 6,999,299 B2* | 2/2006 | Shimizu et al. | 361/306.2 |
| 7,023,073 B2* | 4/2006 | Mano | 257/659 |
| 7,050,304 B2* | 5/2006 | Hsu et al. | 361/719 |
| 7,115,431 B2* | 10/2006 | Chen | 438/30 |
| 7,186,919 B2* | 3/2007 | Kim et al. | 174/250 |
| 7,190,592 B2* | 3/2007 | Hu | 361/763 |
| 7,208,832 B2* | 4/2007 | Yamagata | 257/701 |
| 7,223,652 B2 | 5/2007 | Ooi et al. | |
| 7,239,014 B2 | 7/2007 | Ogawa et al. | |
| 7,279,771 B2* | 10/2007 | Sunohara et al. | 257/516 |
| 7,293,356 B2* | 11/2007 | Sohn et al. | 29/852 |
| 7,307,852 B2* | 12/2007 | Inagaki et al. | 361/760 |
| 7,317,610 B2* | 1/2008 | Nakamura et al. | 361/540 |
| 7,326,858 B2* | 2/2008 | Lee et al. | 174/260 |
| 7,327,554 B2* | 2/2008 | Otsuka et al. | 361/306.3 |
| 7,335,531 B2* | 2/2008 | Iijima et al. | 438/106 |
| 7,342,803 B2* | 3/2008 | Inagaki et al. | 361/763 |
| 7,350,296 B2* | 4/2008 | Ryu et al. | 29/852 |
| 7,375,022 B2* | 5/2008 | Oi et al. | 438/622 |
| 7,449,900 B2* | 11/2008 | Yamagishi | 324/754 |
| 7,485,569 B2* | 2/2009 | Ryu et al. | 438/624 |
| 7,662,694 B2* | 2/2010 | Sakamoto et al. | 438/389 |
| 2003/0086248 A1 | 5/2003 | Mashino | 361/767 |
| 2003/0116348 A1 | 6/2003 | Nakatani et al. | 174/260 |
| 2004/0087058 A1* | 5/2004 | Ooi et al. | 438/106 |
| 2005/0093095 A1* | 5/2005 | Yamagata | 257/532 |
| 2005/0104209 A1* | 5/2005 | Kang | 257/737 |
| 2005/0130368 A1* | 6/2005 | Ooi et al. | 438/240 |
| 2005/0167795 A1* | 8/2005 | Higashi | 257/678 |
| 2005/0185382 A1* | 8/2005 | Ooi et al. | 361/718 |
| 2005/0207091 A1* | 9/2005 | Kambe et al. | 361/301.1 |
| 2005/0218480 A1* | 10/2005 | Usui et al. | 257/632 |
| 2005/0258548 A1* | 11/2005 | Ogawa et al. | 257/778 |
| 2005/0263874 A1* | 12/2005 | Shimizu et al. | 257/700 |
| 2005/0285147 A1* | 12/2005 | Usui et al. | 257/202 |
| 2006/0001063 A1 | 1/2006 | Lee | 257/295 |
| 2006/0008579 A1* | 1/2006 | Yamasaki et al. | 427/79 |
| 2006/0014327 A1* | 1/2006 | Cho et al. | 438/125 |
| 2006/0051917 A1* | 3/2006 | Baniecki et al. | 438/250 |
| 2006/0051949 A1* | 3/2006 | Nemoto | 438/597 |
| 2006/0124347 A1* | 6/2006 | Takaike | 174/254 |
| 2006/0171130 A1* | 8/2006 | Konishi et al. | 361/760 |
| 2006/0180938 A1* | 8/2006 | Kurihara et al. | 257/773 |
| 2006/0197184 A1* | 9/2006 | Ol et al. | 257/532 |
| 2006/0207791 A1* | 9/2006 | Kim et al. | 174/266 |
| 2006/0214206 A1* | 9/2006 | Shuto | 257/295 |
| 2006/0250749 A1* | 11/2006 | Kurihara et al. | 361/306.3 |
| 2006/0262481 A1* | 11/2006 | Mashiko | 361/306.2 |
| 2006/0272853 A1* | 12/2006 | Muramatsu et al. | 174/262 |
| 2007/0158832 A1* | 7/2007 | Takaike | 257/734 |
| 2008/0017407 A1* | 1/2008 | Kawano | 174/260 |
| 2008/0030968 A1* | 2/2008 | Mashino | 361/767 |
| 2008/0291649 A1 | 11/2008 | Mashino | |
| 2009/0290317 A1* | 11/2009 | Mashino | 361/782 |

FOREIGN PATENT DOCUMENTS

| | | |
|---|---|---|
| EP | 0817259 A3 | 12/1999 |
| JP | 06-268141 | 9/1994 |
| JP | 7-245233 | 9/1995 |
| JP | 2001-291637 | 10/2001 |
| JP | 2006-120696 | 5/2006 |

* cited by examiner

CAPACITOR BUILT-IN SUBSTRATE AND METHOD OF MANUFACTURING THE SAME AND ELECTRONIC COMPONENT DEVICE

CROSS-REFERENCE TO RELATED APPLICATIONS

This application is based on and claims priority of Japanese Patent Application No. 2006-217955 filed on Aug. 10, 2006, the entire contents of which are incorporated herein by reference.

BACKGROUND OF THE INVENTION

1. Field of the Invention

The present invention relates to a capacitor built-in substrate and a method of manufacturing the same and an electronic component device and, more particularly, a capacitor built-in substrate applicable to a wiring substrate on which a semiconductor chip is mounted and in which a capacitor acting as a decoupling capacitor is built and a method of manufacturing the same and an electronic component device utilizing the same.

2. Description of the Related Art

In the prior art, there is the electronic component device constructed by mounting the semiconductor chip on the wiring substrate in which the decoupling capacitor is built. As shown in FIG. 1, in an example of such electronic component device, first wiring layers 100 are embedded in a first interlayer insulating layer 200 in a state that their lower surfaces are exposed, and second wiring layers 120 connected to the first wiring layers 100 via first via holes VH1 provided in the first interlayer insulating layer 200 are formed on the first interlayer insulating layer 200.

Also, connection terminals 340 of a capacitor component 300 constructed by forming a first electrode 310, a dielectric substance 320, and a second electrode 330 under a supporting body 350 are connected on the second wiring layers 120. A die attaching tape 400 is arranged under the capacitor component 300. Also, a second interlayer insulating layer 220 is formed on the capacitor component 300 such that the capacitor component 300 is embedded in this second interlayer insulating layer 220.

Also, third wiring layers 140 connected to the second wiring layers 120 via second via holes VH2 formed in the second interlayer insulating layer 220 are formed on the second interlayer insulating layer 220. A solder resist 500 to the connection portions of which opening portions 500x are provided is formed on the third wiring layers 140. Also, bumps 600a of a semiconductor chip 600 are flip-chip connected to connection portions of the third wiring layers 140.

In Patent Literature 1 (Patent Application Publication (KO-KAI) 2001-291637), it is set forth that the spherical capacitor constructed such that the first electrode, the dielectric substance, and the second electrode are stacked on a surface of the spherical core and electrode portions of the first electrode are exposed is provided and connected to the electric wire circuit of the wiring substrate.

In Patent Literature 2 (Patent Application Publication (KO-KAI) 2006-120696), it is set forth that the capacitor being constructed by the internal electrode formed of the porous metal layer in which a plurality of bubbles are provided from an inner surface to an outer surface, the dielectric layer provided onto inner surfaces of the bubbles and an outer surface of the internal electrode, and the external electrode formed to contact the dielectric layer is inserted into the circuit substrate, and then the semiconductor chip is mounted on such circuit substrate.

In the above electronic component device shown in FIG. 1 in the prior art, the capacitor component 300 on the lower side of which the connection terminals 340 are flat-mounted on the wiring substrate. In order to connect the semiconductor chip 600 to the capacitor component 300, the capacitor component 300 must be lifted up to the overlying third wiring layers 140 via the second via holes VH2 after the connection terminals 340 of the capacitor component 300 are connected to the second wiring layers 120, and the capacitor component 300 is buried with the second interlayer insulating layer 220. Therefore, wiring routes from the capacitor component 300 to the semiconductor chip 300 are relatively long.

As a result, a relatively large inductance exists between leads of the semiconductor chip 600 to the capacitor component 300. In some cases, an effect of the decoupling capacitor cannot be sufficiently achieved.

Also, in the prior art, such problems have arisen that it is difficult to change the wiring routes because positions of the connection terminals of the capacitor component are restricted, and a circuit design is restricted and a margin of design is small because the die attaching tape must be used, and others.

Further, in case the two-terminal type stacked ceramic capacitor having the connection terminals on the side surfaces is built in the wiring substrate, the leading of wirings is required similarly. As a result, the similar problems have arisen.

SUMMARY OF THE INVENTION

It is an object of the present invention to provide a capacitor built-in substrate in which a capacitor can be arranged in a closer position to a semiconductor chip and be connected thereto and whose margin of design is large, and an electronic component device utilizing the same.

The present invention is concerned with a capacitor built-in substrate, which includes a base resin layer; a plurality of capacitors arranged side by side in a lateral direction in a state that the capacitors are passed through the base resin layer, each of the capacitors constructed by a first electrode provided to pass through the base resin layer and having projection portions projected from both surface sides of the base resin layer respectively such that the projection portion on one surface side of the base resin layer serves as a connection portion, a dielectric layer for covering the projection portion of the first electrode on other surface side of the base resin layer, and a second electrode for covering the dielectric layer; a through electrode provided to pass through the base resin layer and having projection portions projected from both surface sides of the base resin layer respectively; and a built-up wiring formed on the other surface side of the base resin layer and connected to the second electrodes of the capacitors and one end side of the through electrode.

In the capacitor built-in substrate of the present invention, a plurality of capacitors and the through electrode are arranged side by side in a lateral direction in a state that the capacitors and the through electrode are passed through the base resin layer. The first electrode of the capacitor is formed to pass through the base resin layer, and has projection portions projected from both surface sides of the base resin layer respectively. The projection portion of the first electrode projected on the upper surface side of the base resin layer serves as the connection portion.

Then, the capacitor is constructed by forming sequentially the dielectric layer, which covers the projection portions of the first electrodes on the lower surface side of the base resin layer, and the second electrode. Also, the through electrode has the projection portion that projects from both surfaces of the base resin layer. In addition, the built-up wiring connected to the second electrodes of the capacitors and one end side of the through hole is formed on the lower surface side of the base resin layer.

In this manner, in the capacitor built-in substrate of the present invention, the first and second electrodes of the capacitor and the connection portions of the through electrode are arranged to project to the upper and lower surface sides of the base resin layer respectively, thereby it has a structure that the capacitors and the through electrode individually are connected electrically in upper and lower direction.

Then, the electronic component device is constructed by connecting the semiconductor chip to the connection portions of the first electrodes of the capacitors and the connection portion of the through electrode, which are protruded on the upper surface side of the capacitor built-in substrate. A plurality of capacitors are connected electrically in parallel and functions as the decoupling capacitor. Also, the through electrode is used as the conductive path such as the signal line between the semiconductor chip and the wiring substrate, and the like.

In the capacitor built-in substrate of the present invention, the connection portions of the first electrodes of the capacitors provided to pass through the base resin layer can be connected directly to the semiconductor chip. Therefore, unlike the prior art, there is no need to route around the wiring connected to the capacitor in the wiring substrate upon connecting the wiring to the semiconductor chip. As a result, the inductance between the semiconductor chip and the capacitors can be reduced, and thus the capacitor built-in substrate can perform enough performances as the decoupling capacitor for the semiconductor chip that operates at a high speed. Also, the through electrode utilized as the signal lines, etc. can be arranged in any position. Therefore, there is no need to arrange the bumps particularly between the semiconductor chip and the wiring substrate, and also a margin of design of the electronic component device can be widened.

In addition, the metal posts whose height is high are provided to the base resin layer formed of as the high-supple elastic body (polyimide, or the like) and are utilized as the connection bumps. Therefore, the base resin layer and the metal posts function as a stress relaxing layer upon flip-chip connecting the semiconductor chip. As a result, reliability of the electronic component device can be improved.

Further, the capacitor is constructed by coating the dielectric layer and the second electrode on the projection portion (the convex curved surface, or the like) of the first electrode. As a result, the capacitor having a large capacitance rather than the case where the capacitor is constructed in a flat shape can be formed in the equal installation area.

Also, the present invention is concerned with a method of manufacturing a capacitor built-in substrate, which includes the steps of preparing a base resin layer on one surface of which a plurality of metal posts are provided upright, and a metal supporting body on one surface of which a flexible metal layer is formed; pasting the metal supporting body and the base resin layer together by pushing the metal posts on the base resin layer into the flexible metal layer on the metal supporting body to embed the metal posts in the flexible metal layer; forming a first plating opening portion in a portion of the base resin layer on predetermined portions of the metal posts; obtaining a first electrode constructed by the metal posts and the metal bump by forming a metal bump, which projects from an upper surface of the base resin layer, in the first plating opening portion by using an electroplating utilizing the metal supporting body, the flexible metal layer, and the metal posts as a plating power feeding path; forming a dielectric layer for covering the first electrode; obtaining a capacitor by forming a second electrode for covering the dielectric layer; forming a built-up wiring, which is connected electrically to the second electrode of the capacitor, over the capacitor; and exposing the metal posts by removing the metal supporting body and the flexible metal layer.

In the present invention, first, the metal posts are embedded in the flexible metal layer by pushing the metal posts on the base resin layer into the flexible metal layer (tin, or the like) on the metal supporting body (copper, or the like). Then, the first plating opening portions are formed in portions of the base resin layer on predetermined portions of the metal posts, and then the metal bumps that protrude from the bottom of the first plating opening portions to the upper side of the base resin layer and are connected to the metal bumps are formed by the electroplating, so that the capacitor first electrode can be obtained. At this time, a top end portion of the metal bump is formed as the convex curved surface. Then, the capacitor is obtained by forming the dielectric layer, which covers the first electrode, and the second electrode. Then, the built-up wiring connected to the second electrodes of the capacitors is formed. Then, the metal posts serving as the connection portion of the first electrode are exposed by removing the metal supporting body and the flexible metal layer.

The capacitor built-in substrate of the present invention can be easily manufactured by using the above manufacturing method. Also, when the through electrode is built in, the plating opening portions may be formed in portions of the base resin layer on another metal posts after the capacitor is formed, and then the metal bumps may be formed. In addition, the resistor portion can be built in by the same method.

As explained above, according to the present invention, the electronic component device in which the capacitor can be arranged in a closer position to the semiconductor chip and can be connected thereto and whose margin of design is large can be constructed.

DETAILED DESCRIPTION OF THE PREFERRED EMBODIMENTS

Embodiments of the present invention will be explained with reference to the accompanying drawings hereinafter.

First Embodiment

Figure 1:
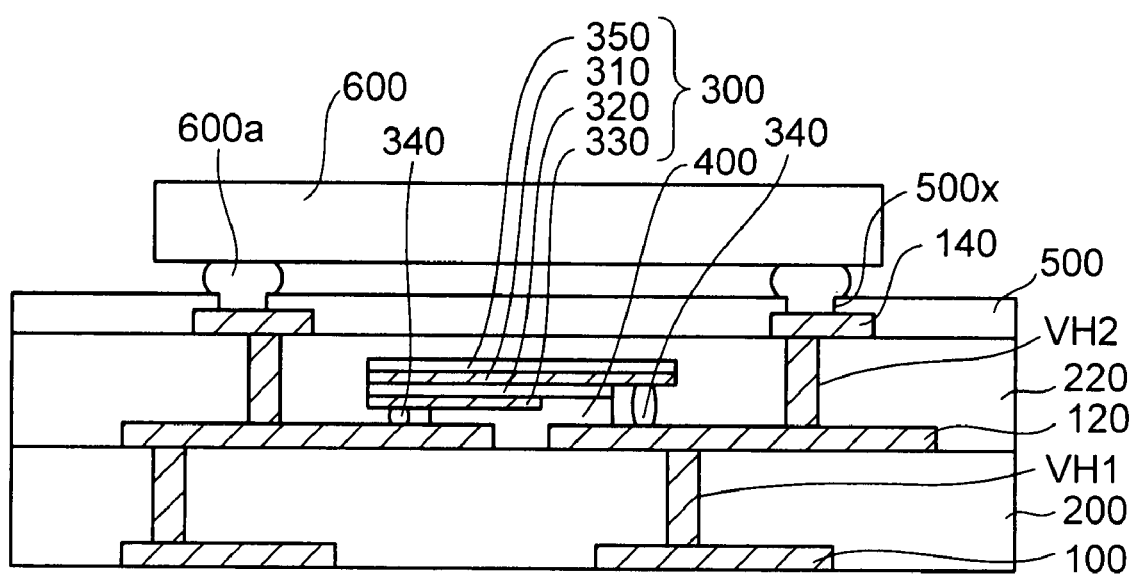
FIG. 1 is a sectional view showing an example of an electronic component device in which a capacitor is built in the prior art.
Figure 2A:
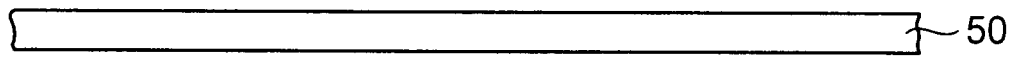
FIGS. 2A to 2S are sectional views showing a method of manufacturing a capacitor built-in substrate according to a first embodiment of the present invention.
Figure 2B:
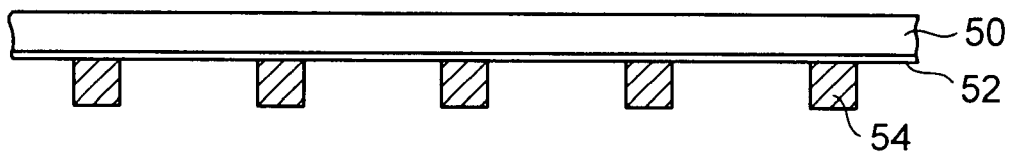
Figure 2C:
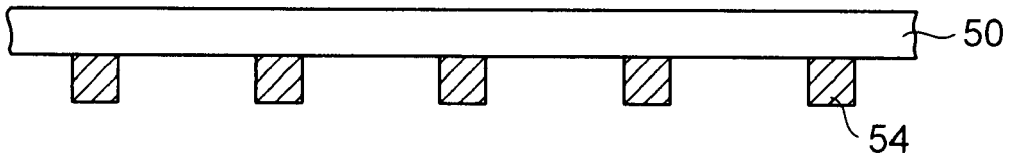
Figure 2D:
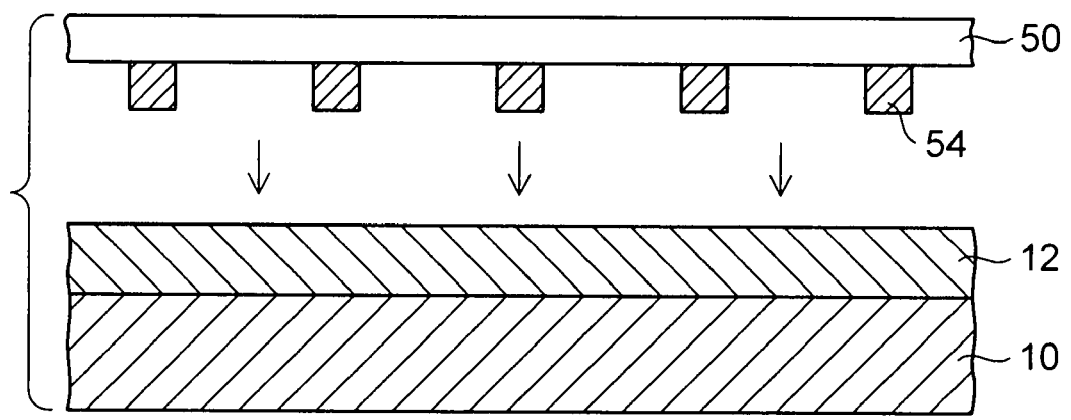
Figure 2E:
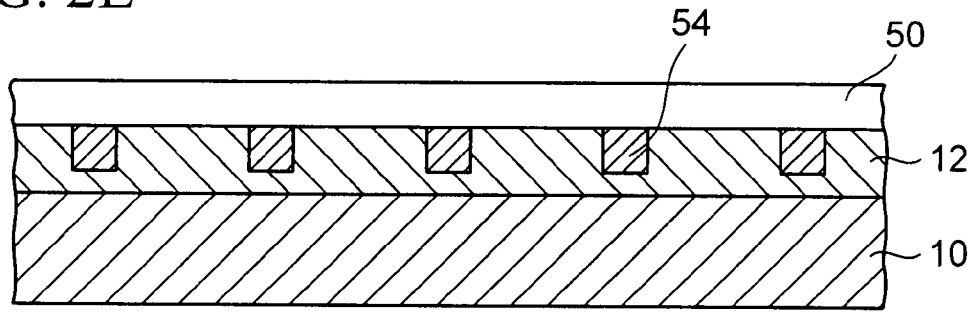
Figure 2F:
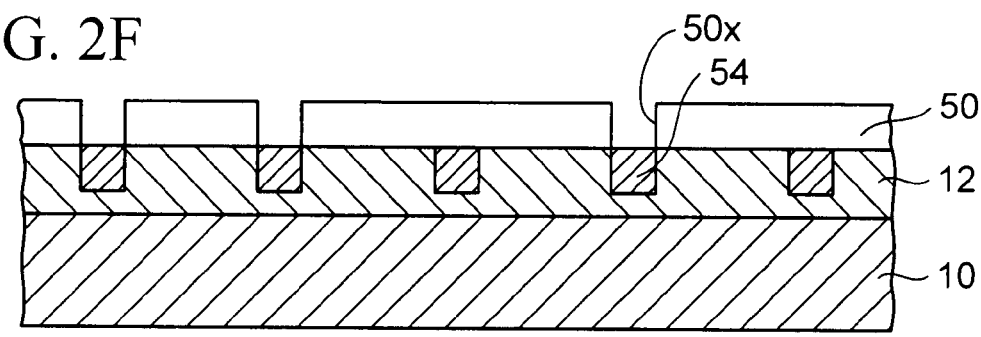
Figure 2G:
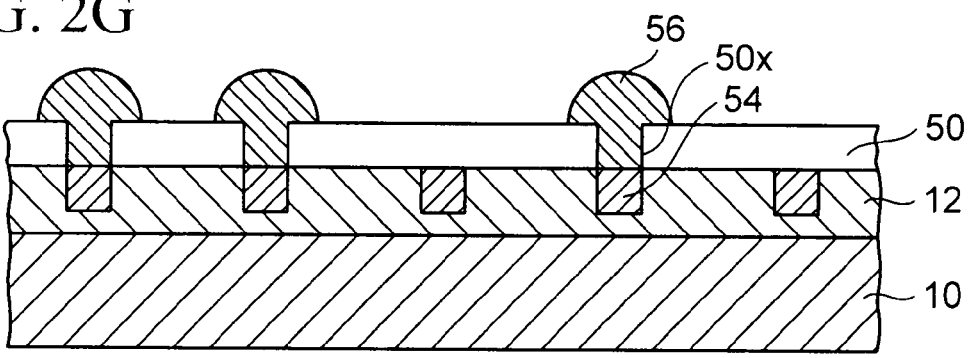
Figure 2H:
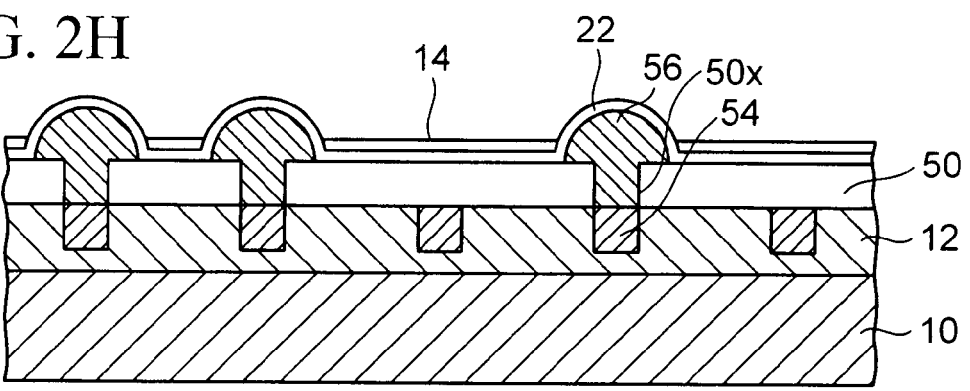
Figure 2I:
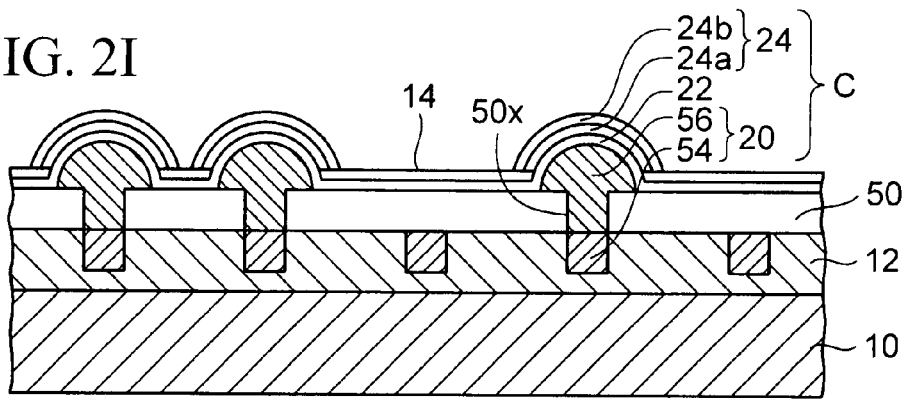
Figure 2J:
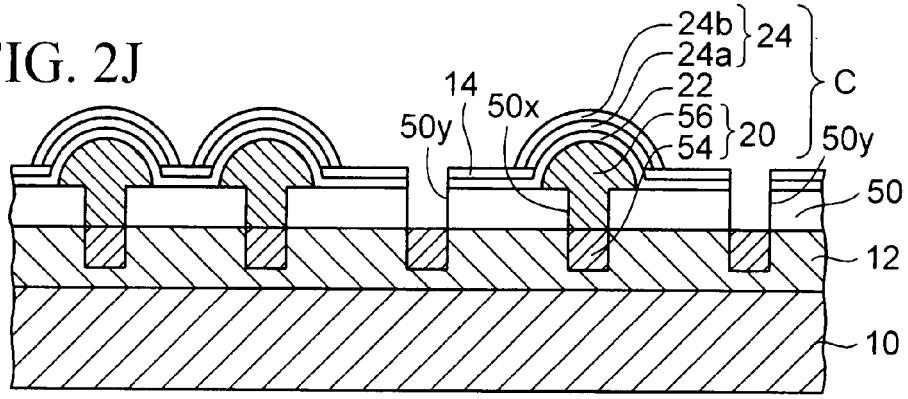
Figure 2K:
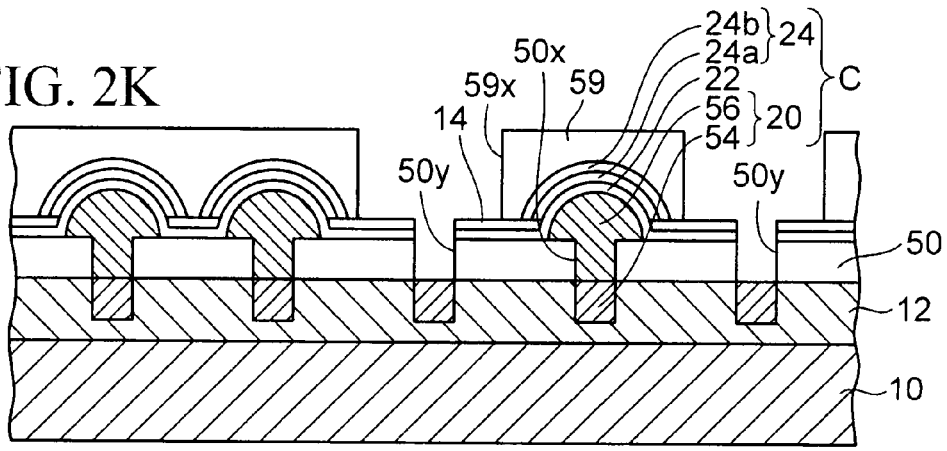
Figure 2L:
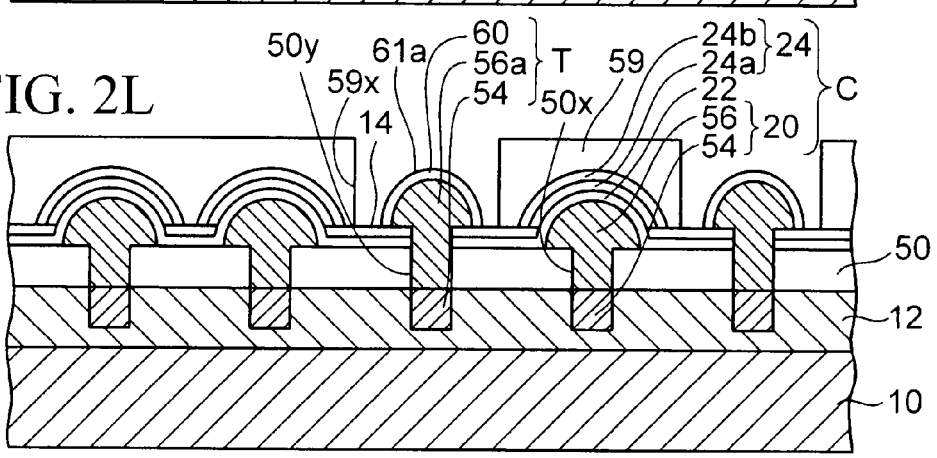
Figure 2M:
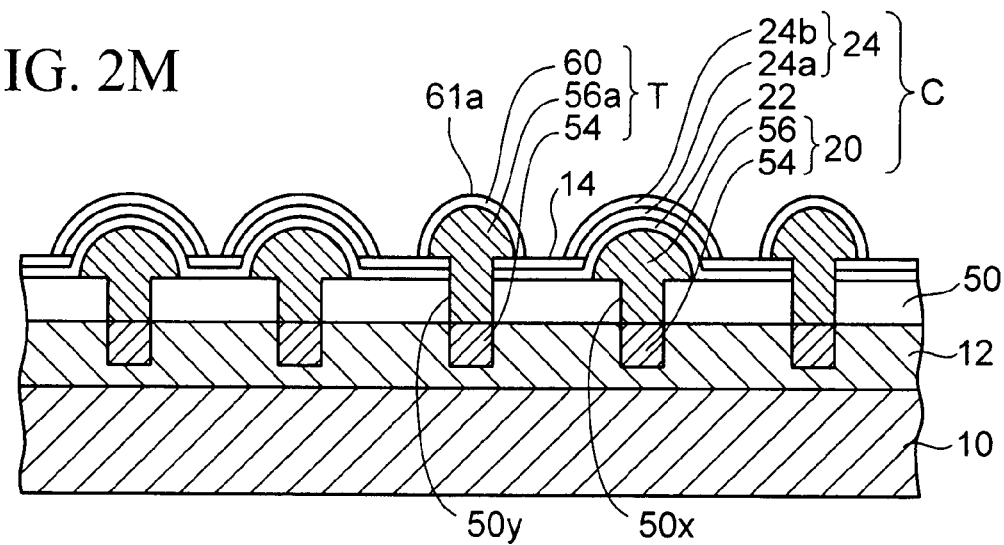
Figure 2N:
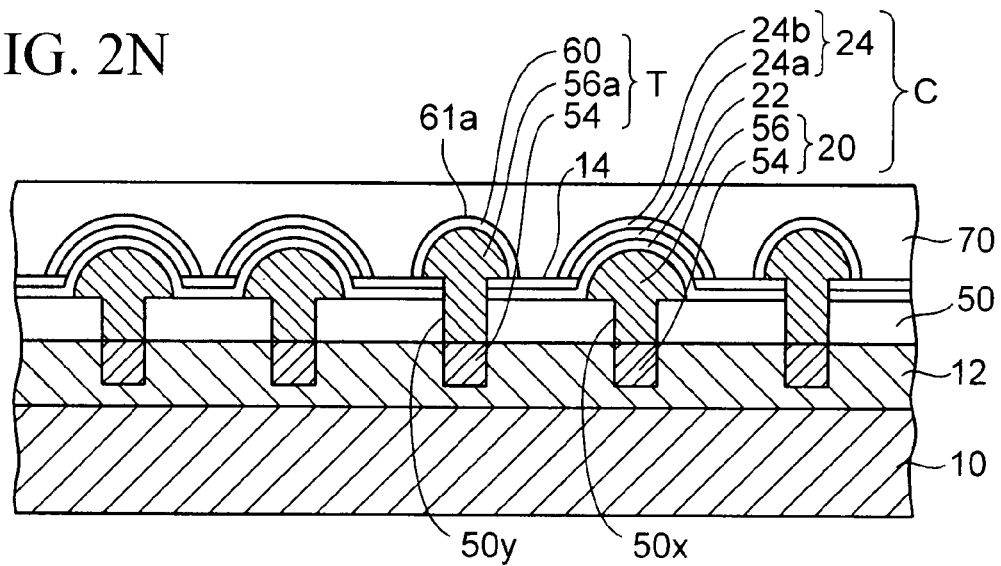
Figure 2O:
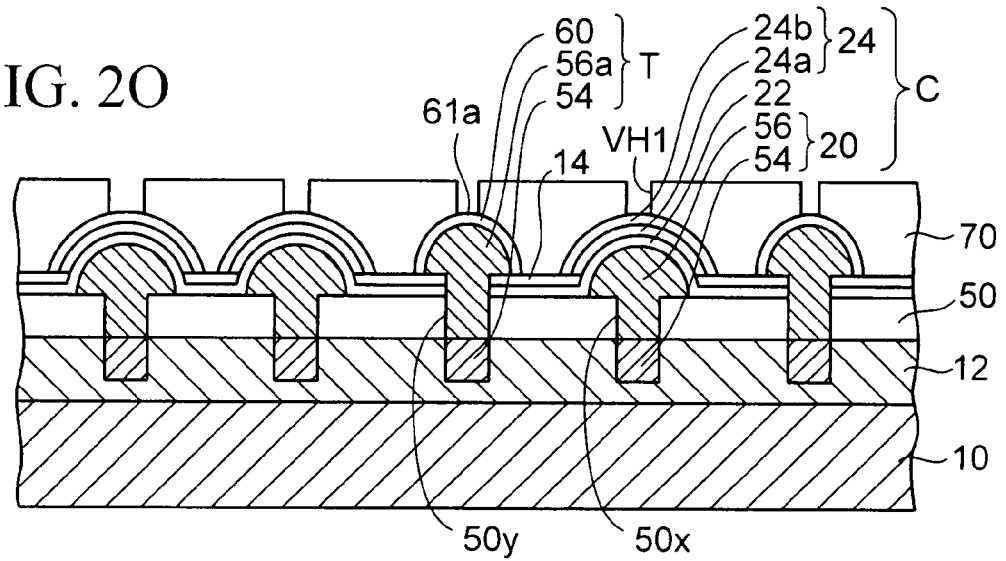
Figure 2P:
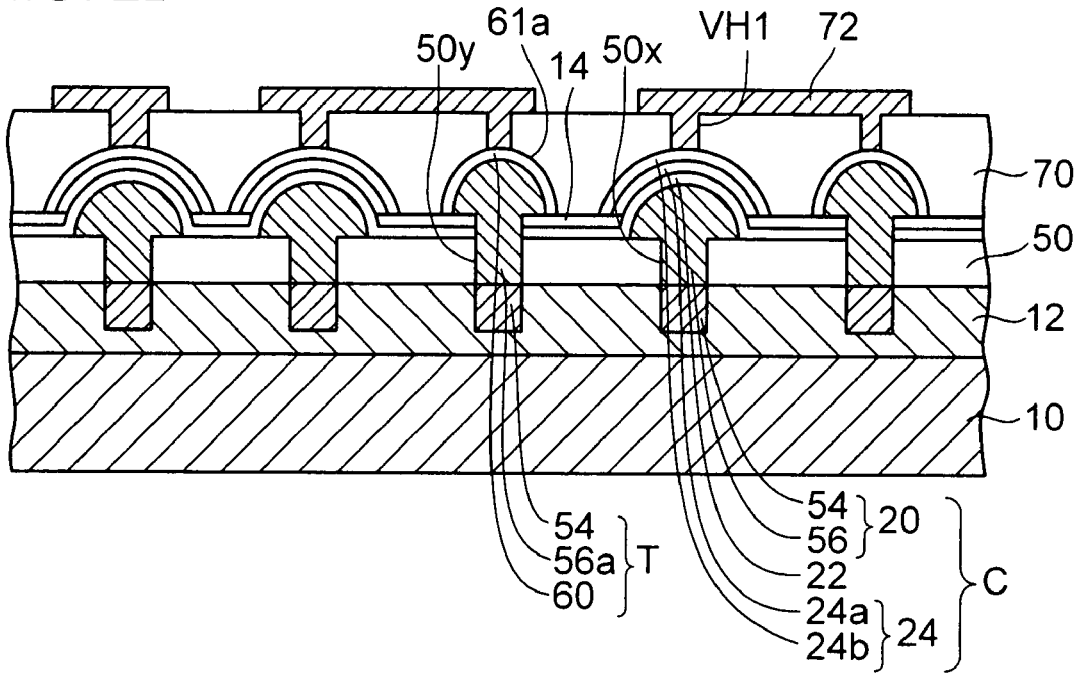
Figure 2Q:
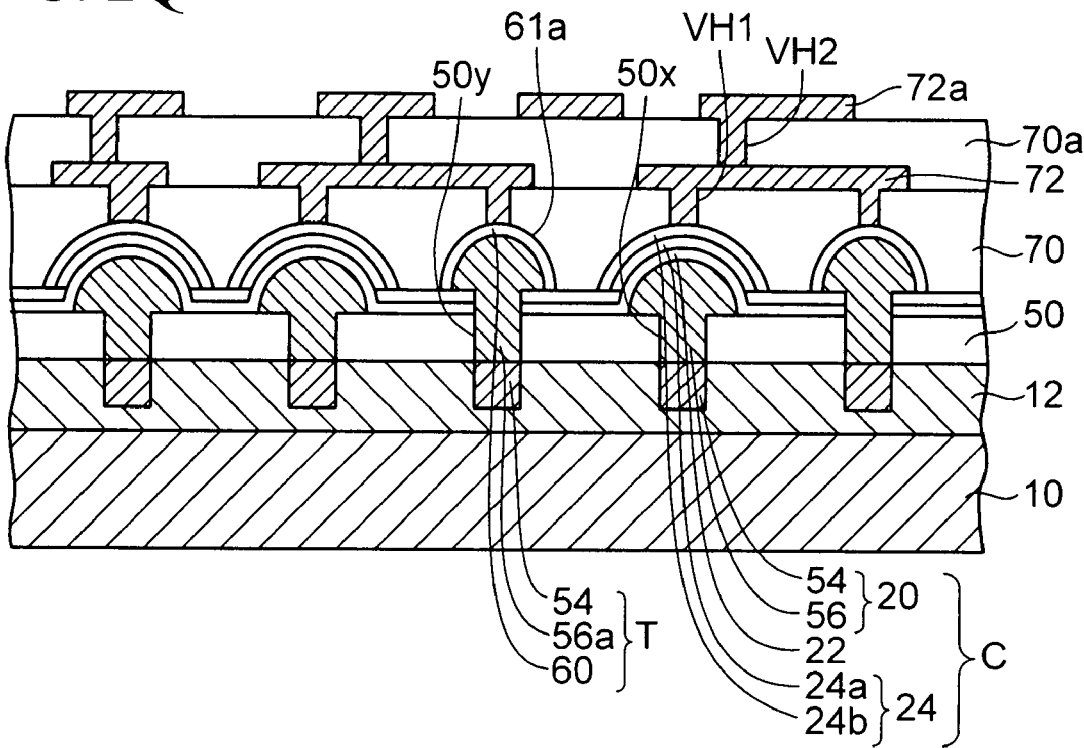
Figure 2R:
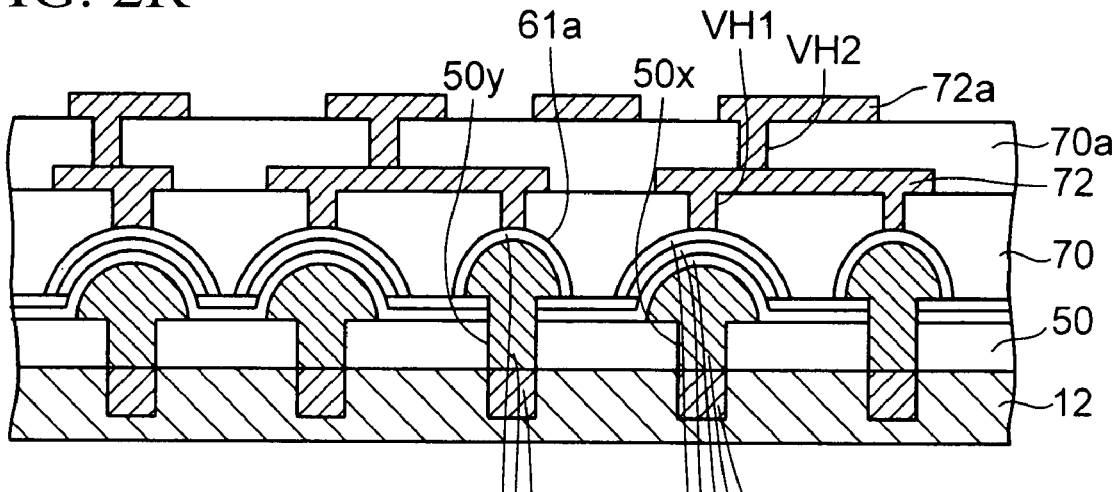
Figure 2S:
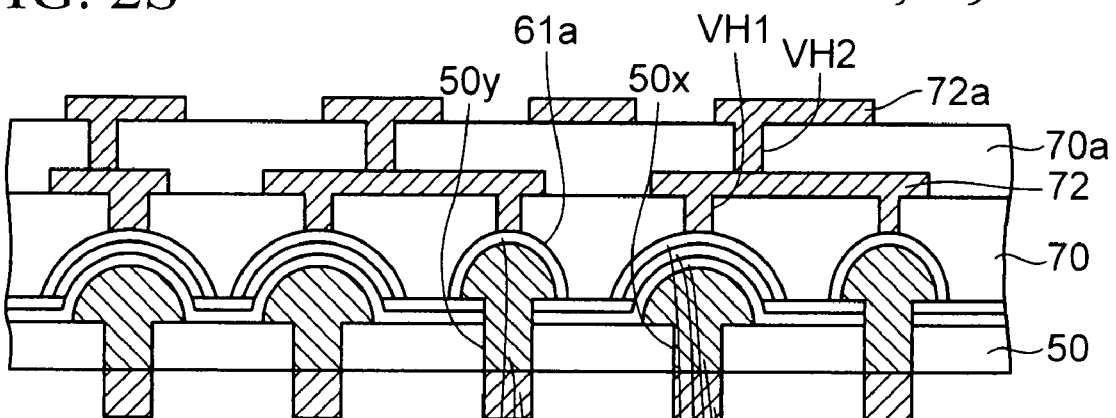
Figure 3:
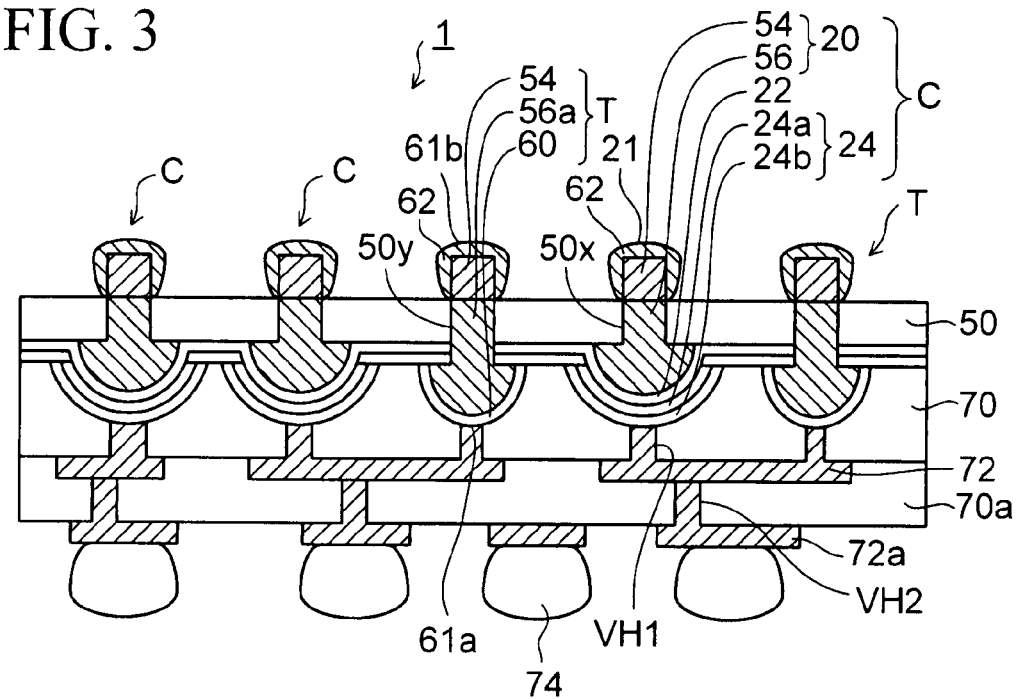
FIG. 3 is a sectional view showing the capacitor built-in substrate according to the first embodiment of the present invention.

FIGS. 2A to 2S are sectional views showing a method of manufacturing a capacitor built-in substrate according to a first embodiment of the present invention, and FIG. 3 is a sectional view showing the capacitor built-in substrate similarly.

In the method of manufacturing the capacitor built-in substrate according to the first embodiment, as shown in FIG. 2A, first, a base resin layer 50 made of a high-supple elastic body such as a polyimide film, an aramid film, or the like and having a film thickness of about 50 μm is prepared. This base resin layer 50 acts finally as an elastic substrate to support a plurality capacitors, and the like. Then, as shown in FIG. 2B, a seed layer 52 made of a copper, or the like is formed on the base resin layer 50 (under the base resin layer 50 in FIG. 2B) by the sputtering.

Then, a resist film (not shown) in which opening portions are opened in positions where copper posts are formed is formed, and a copper layer is formed in the opening portions of the resist film by the electroplating utilizing the seed layer 52 as the plating power feeding path. Then, the resist film is removed. Thus, copper posts 54 (metal posts) are formed on the seed layer 52 (under the seed layer 52 in FIG. 2B) on the base resin layer 50.

Then, as shown in FIG. 2C, respective copper posts 54 are separated electrically by etching the seed layer 52 while using the copper posts 54 as a mask. For example, a height of the copper post 54 is about 30 μm, and an arrangement interval of the copper posts 54 is about 40 μm. In this case, a gold layer may be formed on surfaces of the copper posts 54 by the electroless plating, or the like.

Then, as shown in FIG. 2D, the copper plate 10 as a metal supporting body is prepared, and then a tin layer 12 acting as a flexible metal layer is formed by applying the tin plating onto the copper plate 10. A thickness of the copper plate 10 is 0.3 to 0.4 mm, and a film thickness of the tin layer 12 is about 60 μm.

Then, the base resin layer 50 and the tin layer 12 are pasted together by pushing the copper posts 54 of the structural body in FIG. 2C into the tin layer 12 on the copper plate 10 to oppose to each other. Thus, as shown in FIG. 2E, the copper posts 54 on the base resin layer 50 are embedded in the tin layer 12 on the copper plate 10.

In the present embodiment, the capacitors, the through electrodes utilized in the signal lines, or the like and the resistor portions are built in the substrate. Therefore, forming areas of the capacitors, the through electrode, and the resistor portions are defined on a plurality of copper posts 54 respectively.

Then, as shown in FIG. 2F, portions of the base resin layer 50 on a plurality of copper posts 54, in which the capacitors are to be formed, are processed by the laser or the photolithography, and the plasma etching. Thus, first plating opening portions 50x are formed.

Then, as shown in FIG. 2G, the copper plating is applied from bottom portions of the first plating opening portions 50x upwardly by the electroplating using the copper plate 10, the tin layer 12, and the copper posts 54 as the plating power feeding path. Thus, first copper bumps 56 (metal bumps (projected portions)) filled in the first plating opening portions 50x to project from the upper surface of the base resin layer 50 are formed. A top end portion of the first copper bump 56 is formed like a convex curved surface (hemispherical surface, or the like), and a height of the first copper bump 56 from the upper surface of the base resin layer 50 is set to about 30 μm, for example. In this case, the projected portion of the first copper bump 56 may be formed like a column.

A plurality of first copper bumps 56 formed by this step are connected to the copper posts 54 to constitute the first electrodes of the capacitors. A plurality of first copper bumps 56 are formed on predetermined copper posts 54 in a zigzag arrangement with respect to the copper posts 54 being arranged in an area array type.

Then, as shown in FIG. 2H, a dielectric layer 22 is formed on the base resin layer 50 and the first copper bumps 56 such that the convex curved surfaces of the first copper bumps 56 are covered with the dielectric layer 22. As the dielectric layer 22, a metal oxide layer made of BST ((Ba, Sr)TiO$_3$), STO (SrTiO$_3$), PZT (Pb(Zr,Ti)O$_3$), BTO (BaTiO$_3$), AlOx (alumina), SiOx (silicon oxide), SiN (silicon nitride), NbOx (niobium oxide), TiOx (titanium oxide), or the like or a resin containing fillers of these metal oxides may be employed. These dielectric layers are formed by the sputter method, the MOCVD (metal organic CVD) method, or the like.

Then, as also shown in FIG. 2H, a resist is patterned in areas between a plurality of first copper bumps 56 by the photolithography, and then is cured. Thus, an intermediate resin layer 14 is formed.

Then, as shown in FIG. 2I, the second electrodes 24 are formed by forming sequentially the gold layer 24a and the solder layer 24b on the dielectric layer 22 on the first copper bumps 56 by the electroplating. At this time, since the dielectric layer 22 interposes between the plating power feeding paths of the electroplating, the pulse electroplating that is not affected by the presence of the dielectric layer 22 can be employed. Accordingly, the capacitors C each constructed basically by the first electrode 20 made of the copper post 54 and the first copper bump 56, the dielectric layer 22, and the second electrode 24 made of the gold layer 24a and the solder layer 24b are formed on the copper plate 10.

Then, as shown in FIG. 2J, second plating opening portions 50y are formed by processing respective portions of the base resin layer 50, the dielectric layer 22, and the intermediate resin layer 14, in which the through electrode utilized as the signal line, and the like is formed, between a plurality of copper posts 54. Then, as shown in FIG. 2K, a dry film resist 59 in which opening portions 59x are formed in the areas corresponding to the second plating opening portions 50y and their peripheral areas is formed.

Then, as shown in FIG. 2L, the copper plating is applied from the bottom portions of the second plating opening portions 50y upwardly by the electroplating utilizing the copper plate 10, the tin layer 12, and the copper posts 54 as the plating power feeding path. Thus, second copper bumps 56a filled in the second plating opening portions 50y to project from the upper surface of the base resin layer 50 are obtained. A top end portion of the second copper bump 56a is formed as the convex curved surface. At this time, since the capacitors C are covered with the dry film resist 59, the copper plating can be applied selectively only to the second plating opening portions 50y.

Then, as also shown in FIG. 2L, a contact layer 60 is formed by forming sequentially the gold layer and the solder layer on the second copper bumps 56a by the electroplating respectively, and their top end portions are used as a first connection portion 61a respectively. Accordingly, through electrodes T each constructed basically by the copper post 54 and the second copper bump 56a and the contact layer 60 being connected to the copper post 54 are formed on the copper plate 10. Then, as shown in FIG. 2M, the dry film resist 59 is removed.

In this way, the capacitors C and the through electrodes T can be formed easily on the basis of forming the plating opening portions and the copper bumps on predetermined copper posts 54 out of a plurality of copper posts 54. Because the capacitors C and the through electrodes T are formed by individual processes, the capacitors C can be formed stably with good yield. Further, as described later in a second embodiment, the resistor portions can be formed on the basis of forming the plating opening portions on another copper posts 54.

Then, as shown in FIG. 2N, a first insulating layer 70 for covering the capacitors C and the through electrodes T is formed by pasting a resin film, or the like on an upper surface of the structural body in FIG. 2M. At this time, the first insulating layer 70 is formed to eliminate level differences of the capacitors C and the through electrodes T and get a flat upper surface. Then, as shown in FIG. 2O, first via holes VH1 each reaching the second electrode 24 of the capacitor C and the contact layer 60 of the through electrode T in depth are formed by the laser, or the photolithography and the plasma etching.

Then, as shown in FIG. 2P, first wiring layers 72 connected to the second electrode 24 of the capacitor C and the contact layer 60 of the through electrode T are formed on the first insulating layer 70 by the semi-additive process, or the like. In explaining in more detail, first a seed layer (not shown) made of copper, or the like is formed on inner surfaces of the first via holes VH1 and the first insulating layer 70 by the electroless plating, the sputter method, or the like. Then, a resist (not shown) having opening portions corresponding to the first wiring layer 72 is formed on the seed layer. Then, metal pattern layers (not shown) made of copper, or the like are formed in the opening portions in the resist by the electroplating utilizing the seed layer in place of the plating power feeding layer.

Then, the resist is removed, and then the first wiring layers 72 are formed by etching the seed layer using the metal pattern layers as a mask. In this case, the subtractive process or the full additive process may be used as the semi-additive process.

Then, as shown in FIG. 2Q, a second insulating layer 70a for covering the first wiring layers 72 is formed. Then, second via holes VH2 each reaching the first wiring layer 72 in depth are formed by processing the second insulating layer 70a. Then, second wiring layers 72a each connected to the first wiring layer 72 via the second via hole VH2 are formed on the second insulating layer 70a.

Thus, a double-layer built-up wiring connected to the second electrode 24 of the capacitor C and the contact layer 60 of the through electrode T selectively is formed on them. In FIG. 2Q, a mode in which the double-layer built-up wiring is formed is illustrated. But an n-layered (n is an integer of 1 or more) built-up wiring can be formed appropriately.

Then, as shown in FIG. 2R, the copper plate 10 is removed selectively from the tin layer 12 by etching the copper plate 10 of the structural body in FIG. 2Q by using an ammonia-based alkaline etchant. Then, as shown in FIG. 2S, the tin layer 12 is removed selectively from the copper posts 54 and the base resin layer 50 by etching the tin layer 12 by using a nitric acid-based etchant. Accordingly, the base resin layer 50 and the copper posts 54 are exposed from the lower surface side.

Then, as shown in FIG. 3, the structural body in FIG. 2S is turned upside down, the flux is coated on respective copper posts 54 of the capacitors C and the through electrodes T, the solder are attached selectively to the copper posts 54 by the powder coating, and solder layers 62 each covering the copper post 54 are formed by the reflow heating. The solder layers 62 can be adhered stably onto the copper posts 54 by the powder coating if the gold layer is formed on the surfaces of the copper posts 54.

Accordingly, in the capacitors C, the copper posts 54 are covered with the solder layer 62 respectively and their top end portions act as the connection portions 21 of the first electrodes 20. Also, in the through electrodes T, the copper posts 54 are covered with the solder layer 62 respectively and their top end portions act as second connection portions 61b. Then, external connection terminals 74 are provided by mounting a solder ball, or the like on the second wiring layers 72a that are exposed on the lowest side respectively. In this case, when a plurality of capacitor built-in substrates are obtained from one substrate, the substrate is cut before or after the external connection terminals 74 are provided.

With the above, a capacitor built-in substrate 1 of the first embodiment can be obtained.

As shown in FIG. 3, in the capacitor built-in substrate 1 of the first embodiment, a plurality of capacitors C and the through electrodes T are arranged side by side in the lateral direction in a state that they are passed through the base resin layer 50 arranged as the uppermost layer. The capacitor C is constructed basically by the first electrode 20 made of the copper post 54 and the first copper bump 56, the dielectric layer 22, and the second electrode made of the gold layer 24a and the solder layer 24b. The copper post 54 (projected portion) constituting the first electrode 20 is formed to project from the upper surface of the base resin layer 50, and its top end portion acts as the connection portion 21 of the first electrode 20 by coating the solder layer 62 on the projected portion.

Also, the first copper bump 56 (projected portion) connected to the copper post 54 is formed to pass through the base resin layer 50 and project from the lower surface of the base resin layer 50, and its top end portion constitutes a convex curved surface (hemispherical surface, or the like). In this way, the first electrode 20 of the capacitor C is constructed by the connection portion 21 being projected from the upper surface of the base resin layer 50 and the first copper bump 56 being connected to the connection portion 21 and projected from the lower surface of the base resin layer 50 such that its top end portion constitutes a convex curved surface. Also, the dielectric layers 22 for covering the convex curved surface of the first electrode 20 respectively are formed, and the second electrodes 24 each made of the gold layer 24a and the solder layer 24b and for covering the dielectric layer 22 are formed.

Also, the through electrodes T as well as the capacitors C are provided to the base resin layer 50. The through electrode T is constructed basically by the copper post 54 projected from the upper surface of the base resin layer 50 and the second copper bump 56a being connected to the copper post 54 and passed through the base resin layer 50 to project from the lower surface of the base resin layer 50 such that its top end portion constitutes a convex curved surface. The second copper bump 56a is covered with the contact layer 60 made of the gold layer and the solder layer, and its top end portion constitutes the first connection portion 61a. Also, the copper post 54 is covered with the solder layer 62, and its top end portion constitutes the second connection portion 61b.

Also, the capacitors C and the through electrodes T are covered with the first insulating layer 70, and the first via holes VH1 each having a depth reaching the second electrode 24 of the capacitor C and the first connection portion 61a of the lower contact layer 60 of the through electrode T are formed in the first insulating layer 70. Then, the first wiring layers 72 each connected to the second electrode 24 of the capacitor C and the first connection portion 61a of the through electrode T via the first via hole VH1 are formed on (under in FIG. 3) the first insulating layer 70.

Also, the second insulating layer 70a is formed on (under in FIG. 3) the first wiring layers 72, and the second via holes VH2 reaching the first wiring layer 72 respectively are provided in the second insulating layer 70a. Also, the second wiring layers 72a connected to the first wiring layer 72 via the second via hole VH2 respectively are formed on (under in FIG. 3) the second insulating layer 70a. The external connection terminal 74 is provided to the second wiring layers 72a respectively.

In this manner, the capacitor built-in substrate 1 of the present embodiment is constructed basically in such a fashion that the double-layer built-up wiring connected electrically to the capacitors C and the through electrodes T, which are arranged side by side in the lateral direction to pass through the base resin layer 50, is formed on (under in FIG. 3) the capacitors C and the through electrodes T.

Figure 4:
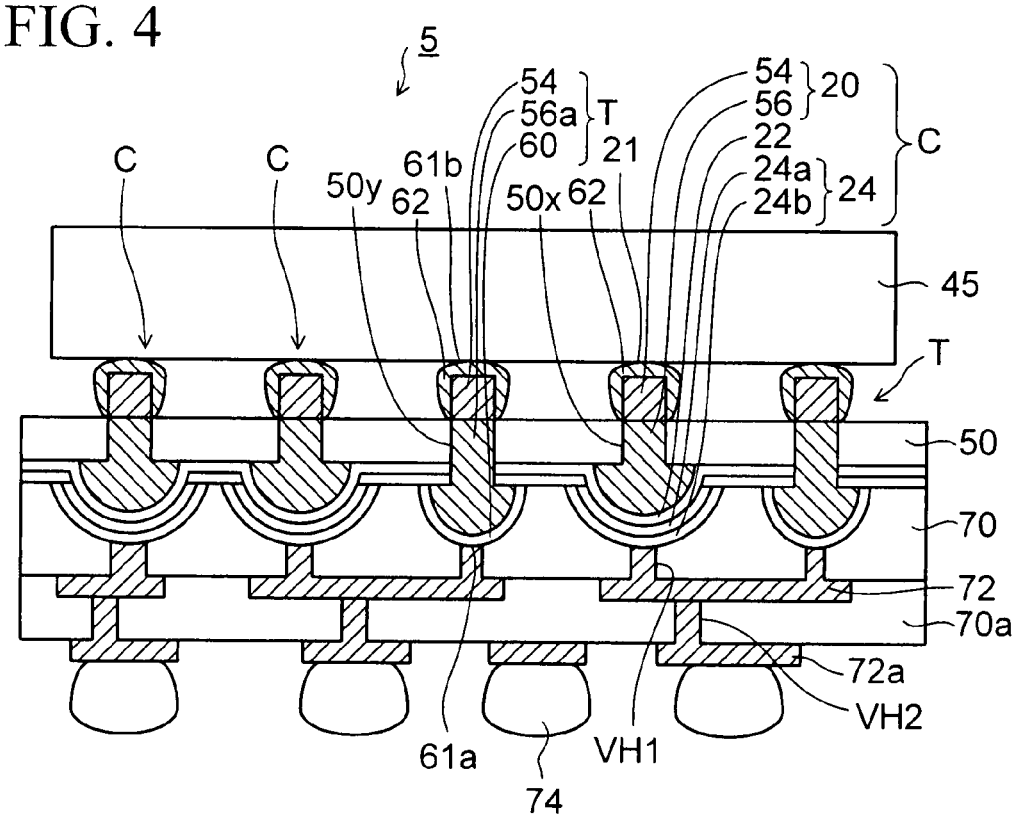
FIG. 4 is a sectional view showing an electronic component device constructed by mounting a semiconductor chip on the capacitor built-in substrate according to the first embodiment of the present invention.

An electronic component device constructed by mounting the semiconductor chip on the capacitor built-in substrate according to the present embodiment is shown in FIG. 4. As shown in FIG. 4, the electronic component device 5 of the present embodiment is constructed such that electrodes (or bumps) of a semiconductor chip 45 are connected to the connection portion 21 of the first electrode 24 of the capacitor C and the second connection portion 61b of the through electrode T, which are projected from the upper surface of the base resin layer 50 of the capacitor built-in substrate 1.

In the capacitor built-in substrate 1 of the present embodiment, the connection portion 21 of the first electrode 24 of the capacitor C and the second connection portion 61b of the through electrode T are provided to act as the bumps that are used to connect the semiconductor chip 45. The connection portion 21 of the first electrode 20 and the second electrode 24 of the capacitor C, and the first and second connection portions 61a, 61b of the through electrode T are arranged in the vertical direction, and are connected directly to the semiconductor chip 45 and the built-up wiring. A plurality of capacitors C built in the capacitor built-in substrate 1 are arranged in parallel in the lateral direction between the semiconductor chip 45 and the built-up wiring and connected electrically to them. Thereby, the capacitor C acts as the decoupling capacitor.

By constructing the electronic component device 5 in this manner, unlike the prior art, there is no need to connect the wiring layers connected to respective capacitors C to the semiconductor chip 45 by routing around such wiring layers. Therefore, the electrical routes between the capacitors C and the semiconductor chip 45 can be reduced shortest, and the inductance can be reduced. As a result, the capacitors C can achieve sufficient performances as the decoupling capacitor for the semiconductor chip that operates at a high speed.

In addition, in the capacitor built-in substrate 1 of the present embodiment, the through electrodes T serving as the conductive paths such as the signal lines, etc. are built in addition to the capacitors C. Therefore, it is not needed that the bumps should be provided particularly to connect the signal lines, etc. to the wiring substrate.

Also, the capacitors C are constructed by covering the dielectric layer 22 and the second electrode 24 on the first copper bumps 56, each having a convex curved surface. Therefore, the capacitor having a larger capacitance than the case where the capacitor is formed in a flat shape can be formed in the equal installation area.

In addition, in the capacitor built-in substrate 1 of the present embodiment, the copper posts 54 built in the capacitor built-in substrate 1 are used as the bumps to which the semiconductor chip 45 is flip-chip connected. Since the copper posts 54 are formed in the opening portions in the resist by the electroplating, a height of the copper posts can be formed higher at a narrower pitch (100 μm or less) than the case where the normal solder bumps are used. As a result, this capacitor built-in substrate 1 can be used as the wiring substrate that deals with the semiconductor chip whose electrodes are aligned at a narrow pitch.

Further, the copper posts 54 whose height is high are provided to the base resin layer 50 serving as the high-supple elastic body. Therefore, the base resin layer 50 and the copper posts 54 act as a stress relaxing layer in flip-chip connecting the semiconductor chip 45. As a result, reliability of the electronic component device can be improved.

Second Embodiment

Figure 5:
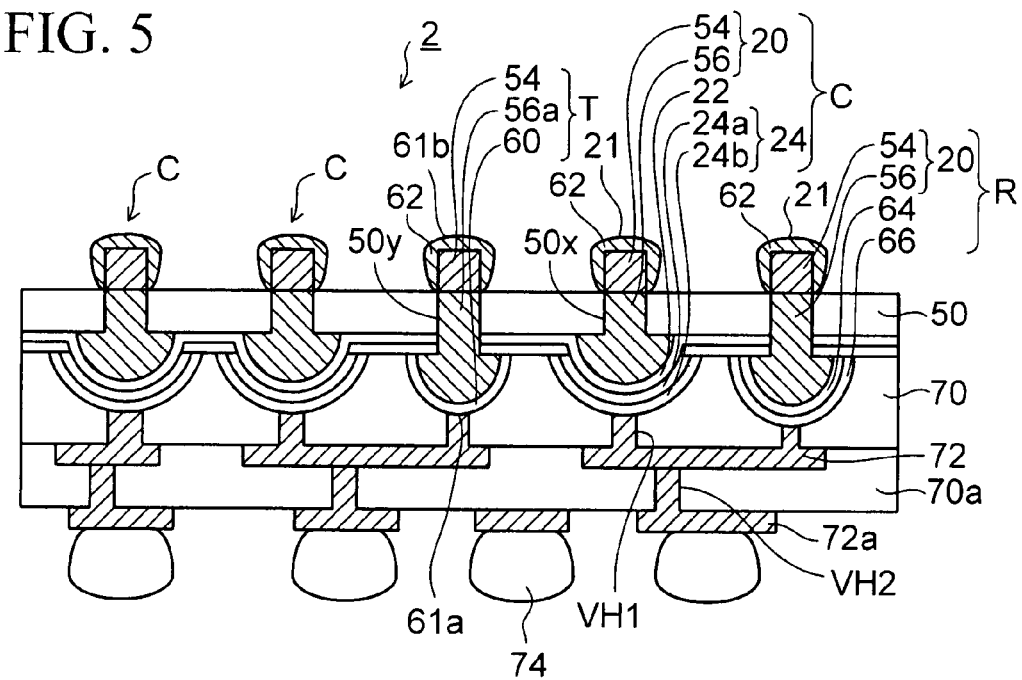
FIG. 5 is a sectional view showing a capacitor built-in substrate according to a second embodiment of the present invention.
Figure 6:
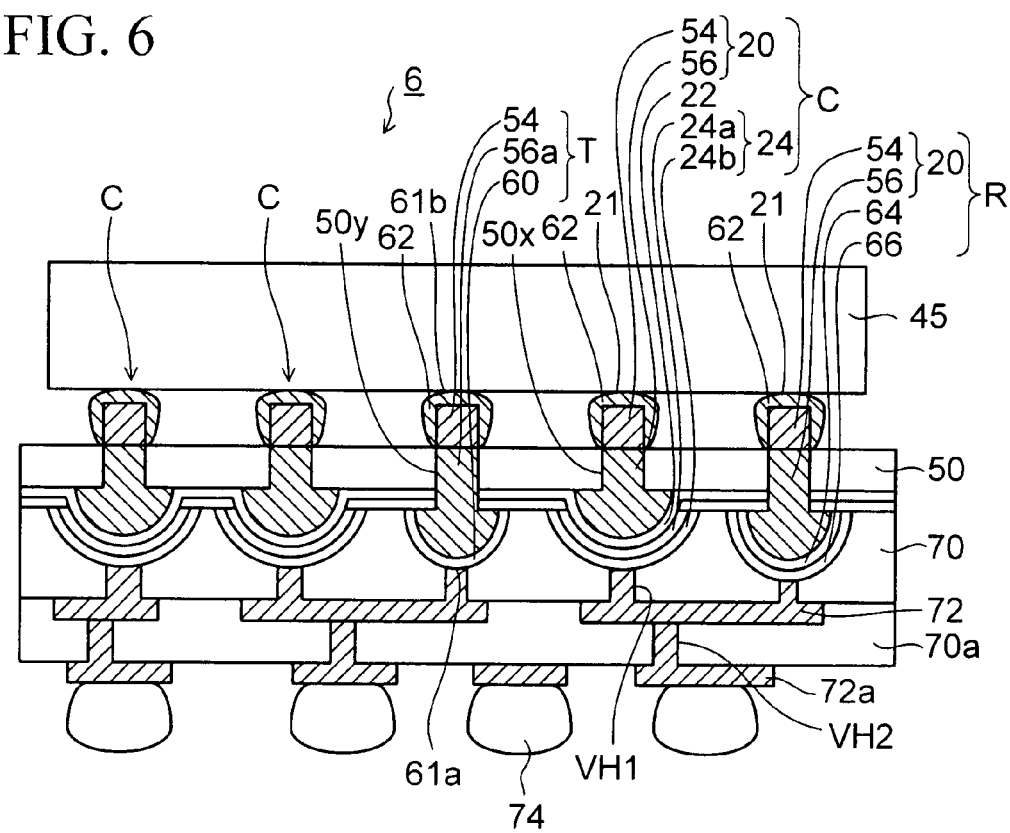
FIG. 6 is a sectional view showing an electronic component device constructed by mounting a semiconductor chip on the capacitor built-in substrate according to the second embodiment of the present invention.

FIG. 5 is a sectional view showing a capacitor built-in substrate according to a second embodiment of the present invention, and FIG. 6 is a sectional view showing an electronic component device constructed by mounting a semiconductor chip on the capacitor built-in substrate. As shown in FIG. 5, in the capacitor built-in substrate 2 of the second embodiment, resistor portions R in addition to the capacitors C and the through electrodes T are built. In an example in FIG. 5, the through electrode T on the rightmost side in FIG. 3 of the first embodiment constitutes the resistor portion R.

The resistor portion R is composed of the first electrode 20 made of the copper post 54 and the first copper bump 56 like the first electrode 20 of the capacitor C, an insulating layer 64 formed on the convex curved surface of the first electrode 20 and made of alumina, silicon nitride, titanium nitride, or the like, and a second electrode 66 formed on the insulating layer 64 and made of gold, or the like.

Also, like the capacitor C, the copper post 54 is covered with the solder layer 62 and a top end portion of the copper post 54 acts as the connection portion 21 of the first electrode 20. Then, the second electrode 66 of the resistor portion R is connected to the first wiring layer 72 of the wiring substrate via the first via hole VH1. Other configurations are similar to those in FIG. 3 of the first embodiment, and therefore their explanation will be omitted herein by affixing the same reference symbols to them.

In order to form the resistor R of the capacitor built-in substrate 2 in the second embodiment, in above steps in FIG. 2L of the first embodiment, the second copper bump 56a is formed on a portion in which the resistor portion is to be formed, then the insulating layer made of alumina, or the like and the gold layer are formed sequentially by the sputtering, and then the insulating layer and the gold layer are formed partially on the copper bump 56 by removing the dry film resist 59. Thus, the resistor portion R may be formed.

An electronic component device 6 constructed by mounting a semiconductor chip on the capacitor built-in substrate 2 of the second embodiment is shown in FIG. 6. As shown in FIG. 6, in the electronic component device 6 of the second embodiment, like the capacitor C, the connection portion 21 of the first electrode 20 and the second electrode 66 of the resistor portion R are arranged vertically, and the electrodes of the semiconductor chip 45 are connected directly to the connection portion 21 of the first electrode 20 of the resistor portion R in addition to the capacitors C and the through holes T.

Like the capacitor C, the resistor portion R is arranged just under the semiconductor chip 45, and the semiconductor chip 45 and the resistor portion R are connect directly to each other not to route around the wiring layer in the wiring substrate. In this manner, the resistor portion R is connected between the semiconductor chip 45 and the second wiring layer 72a of the wiring substrate. Other configurations are similar to those in FIG. 4, and therefore their explanation will be omitted herein by affixing the same reference symbols to them.

The capacitor built-in substrate 2 of the second embodiment has similar effects to those of the first embodiment.

Third Embodiment

FIGS. 7A to 7H are sectional views showing a method of manufacturing a capacitor built-in substrate according to a third embodiment of the present invention. FIG. 8 is a sectional view showing the capacitor built-in substrate similarly. A feature of the third embodiment resides in that the solder layer is utilized finally as the coating layer for the copper post on the basis of filling the solder layer in concave portions provided in the copper plate and then embedding the copper posts in the solder layers. In the third embodiment, detailed explanation of the same steps as those in the first embodiment will be omitted herein.

Figure 7A:
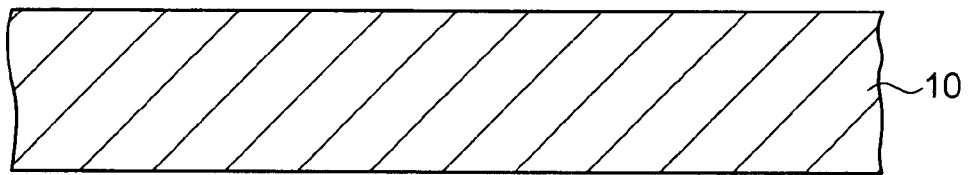
FIGS. 7A to 7H are sectional views showing a method of manufacturing a capacitor built-in substrate according to a third embodiment of the present invention.
Figure 7B:
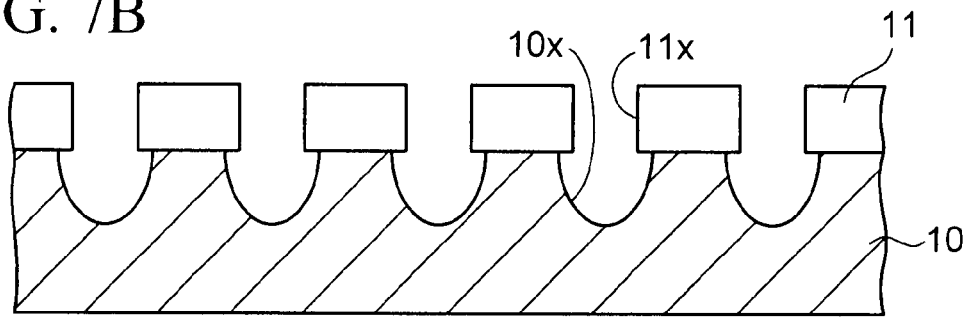
Figure 7C:
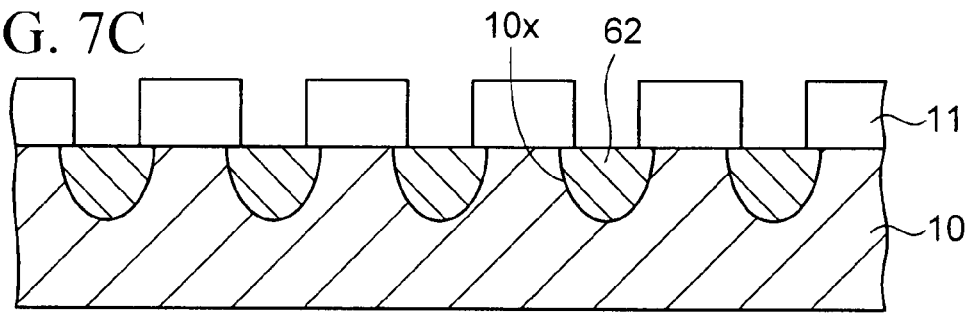
Figure 8:
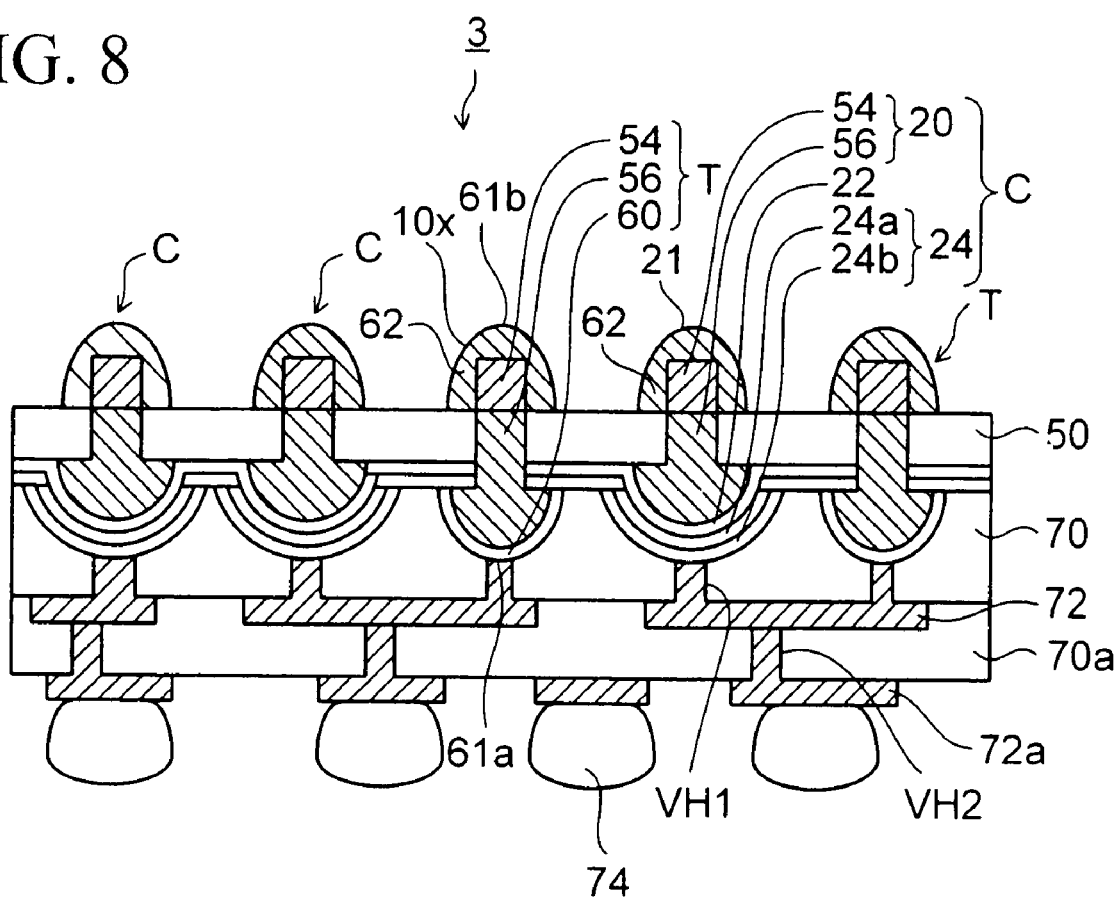
FIG. 8 is a sectional view showing the capacitor built-in substrate according to the third embodiment of the present invention.

In the manufacturing method of the third embodiment, as shown in FIGS. 7A and 7B, the copper plate 10 as a metal supporting body is prepared, and a resist 11 having opening portions 11x is formed on the copper plate 10. Then, concave portions 10x are formed on the copper plate 10 by wet-etching the copper plate 10 through the opening portions 11x in the resist 11. Then, as shown in FIG. 7C, the solder layers 62 are formed in the concave portions 10x of the copper plate 10 by the electroplating utilizing the copper plate 10 as the plating power feeding path. Then, the resist 11 is removed.

Figure 7D:
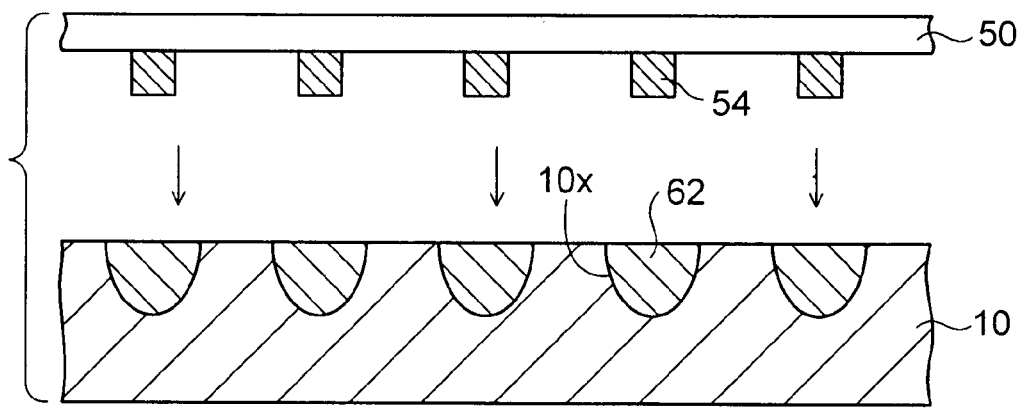
Figure 7E:
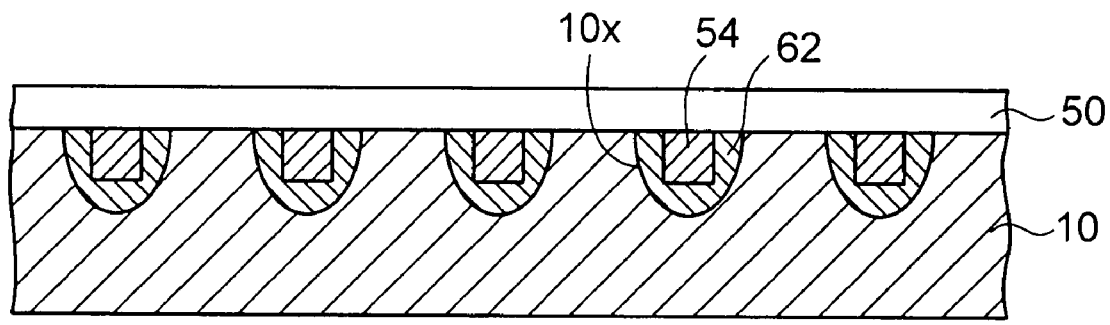

Then, as shown in FIG. 7D, like the first embodiment, the base resin layer 50 on which the copper posts 54 are provided to stand upright is prepared, and then the copper posts 54 are pushed into the solder layers 62 formed in the concave portions 10x of the copper plate 10. The solder layers 62 filled in the concave portions 10x of the copper plate 10 are arranged in the portions corresponding to the copper posts 54. Thus, as shown in FIG. 7E, the base resin layer 50 is pasted onto the copper plate 10 in a state that the copper posts 54 are buried in the solder layers 62 in the concave portions 10x of the copper plate 10.

Figure 7F:
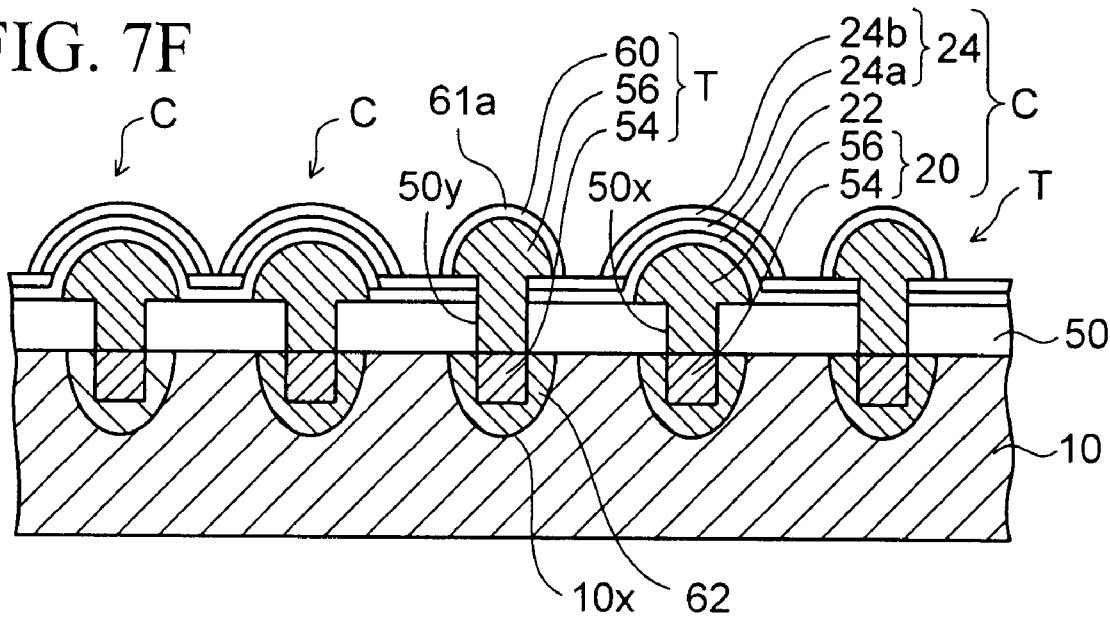

Then, as shown in FIG. 7F, the capacitors C and the through electrodes T are formed on the copper plate 10 by carrying out respective steps from the step in FIG. 2F to the step in FIG. 2M in the first embodiment. Then, as shown in FIG. 7G, a double-layer built-up wiring (the first and second wiring layers 72, 72a and the first and second interlayer insulating layers 70, 70a) connected to the capacitors C and the through electrodes T is formed by carrying out steps in FIG. 2M to FIG. 2Q of the first embodiment.

Figure 7G:
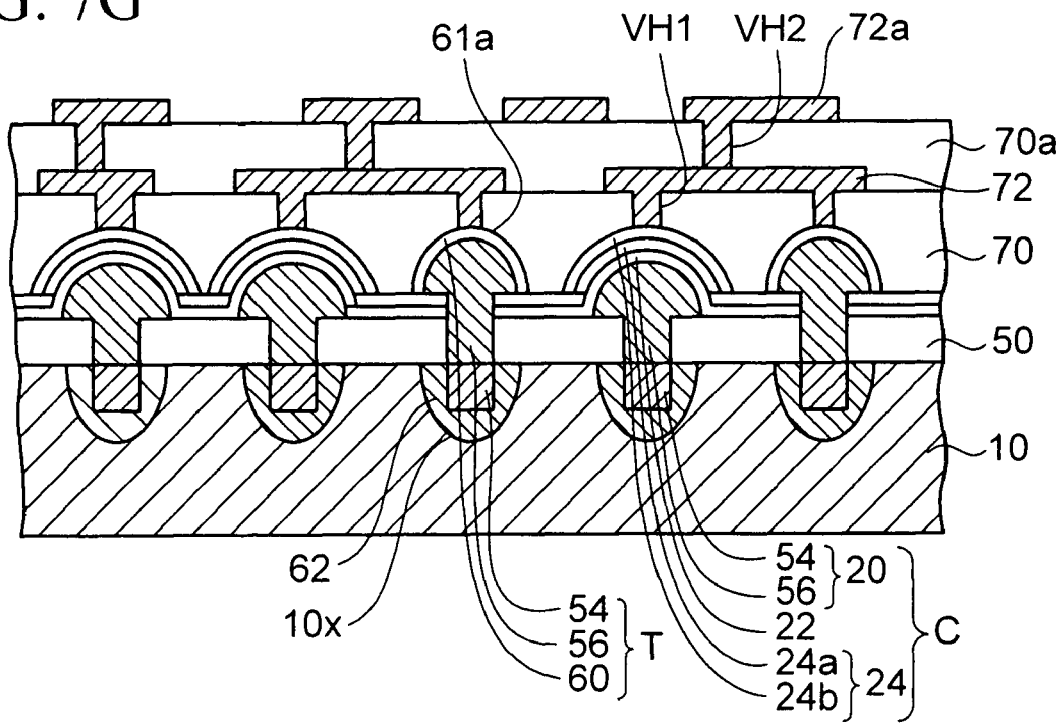
Figure 7H:
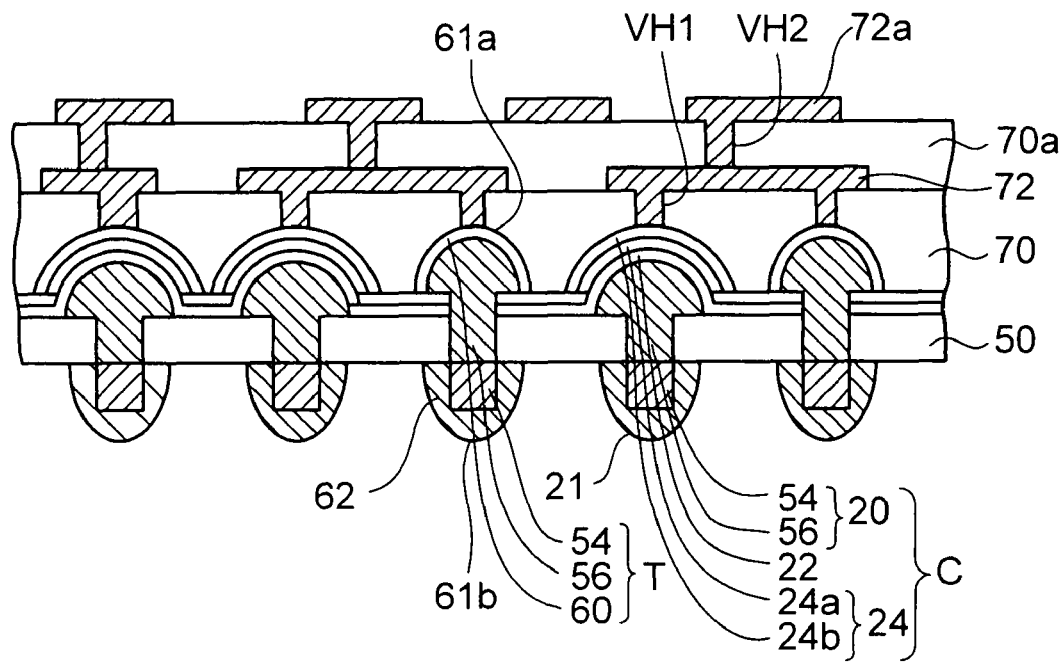

Then, as shown in FIG. 7H, the copper plate 10 is removed from the structural body in FIG. 7G by applying the etching by using an ammonia-based alkaline etchant. Thus, the copper plate 10 is removed selectively to the solder layers 62 and the base resin layer 50, and the solder layers 62 for covering the copper posts 54 are exposed, thereby, the connection portions 21 of the first electrodes 20 of the capacitors C and the second connection portions 61b of the through electrodes T are obtained. Then, as shown in FIG. 8, the structural body in FIG. 7H is turned upside down, and the external connection terminals 74 are provided on the second wiring layers 72a exposed from the lowermost side.

With the above, a capacitor built-in substrate 3 according to the third embodiment having the same configuration as that in the first embodiment can be obtained. In the manufacturing method of the third embodiment, the solder layers 62 filled in the concave portions 10x of the copper plate 10 act as the solder layers 62 for covering the copper posts 54. Therefore, there is no need to cover the copper posts 54 with the solder layer 62 after the copper posts 54 are exposed. Also, since the step of forming the tin layer 12 and the step of removing the tin layer 12 are not needed unlike the first embodiment, this manufacturing method of the third embodiment is advantageous in cost.

The semiconductor chip is mounted on the capacitor built-in substrate 3 of the third embodiment like the first embodiment, and the capacitor built-in substrate 3 can achieve the advantages similar to those in the first embodiment.

What is claimed is:
1. A capacitor built-in substrate, comprising:
    a base resin layer having an opening portion which passes through to a thickness direction;
    a capacitor first electrode filled in a whole of the opening portion and having a first projection portion projected to a lower side from the opening portion and a second projection portion projected to an upper side from the opening portion,
    wherein the first projection portion serves as a connection portion and an end and a side of the first projection portion are exposed, and the second projection portion has a hemispherical shape;
    a capacitor dielectric layer covering a surface of the hemispherical shape of the second projection portion of the capacitor first electrode and
    a capacitor second electrode covering the dielectric layer;
    wherein the capacitor is constructed by the capacitor first electrode, the dielectric layer, and the capacitor second electrode, and is arranged from the opening portion of the base resin layer onto the opening portion,
    and a plurality of capacitors are arranged in a lateral direction in a state that the capacitors are passed through the base resin layer, wherein an intermediate resin layer is formed between at least two of said plurality of capacitors,
    a through electrode provided to pass through the base resin layer and having projection portions projected from both surface sides of the base resin layer respectively; and
    a built-up wiring formed on the base resin layer and connected to the capacitor second electrodes and one end side of the through electrode.
2. A capacitor built-in substrate according to claim 1, further comprising:
    a resistor portion constructed by
    a first electrode provided to pass through the base resin layer and having projection portions projected from both surface sides of the base resin layer respectively, whereby the projection portion on one surface side of the base resin layer serves as a connection portion;
an insulating layer for covering the first electrode on other surface side of the base resin layer; and
a second electrode for covering the insulating layer;
wherein the second electrode of the resistor portion is connected to the built-up wiring.

3. An electronic component device, comprising:
the capacitor built-in substrate set forth in any one of claims 1 and 2; and
a semiconductor chip mounted to be connected to the connection portion of the capacitor first electrode and other end side of the through electrode.

* * * * *